United States Patent
Bowen et al.

(10) Patent No.: US 6,329,877 B1
(45) Date of Patent: Dec. 11, 2001

(54) EFFICIENT POWER AMPLIFIER

(75) Inventors: John Wayne Bowen, Warminster; Roger Anthony Fratti, Cumru Township, Berks County; James Daniel Yoder, Leola, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/344,756

(22) Filed: Jun. 25, 1999

(51) Int. Cl.[7] .............................. H03F 3/68; H03F 3/60; H03F 3/04
(52) U.S. Cl. ................... 330/124 R; 330/53; 330/286; 330/302
(58) Field of Search .................................. 330/53, 54, 57, 330/124 R, 286, 295, 302

(56) References Cited

U.S. PATENT DOCUMENTS

| | | | | |
|---|---|---|---|---|
| 5,304,943 | * | 4/1994 | Koontz | 330/295 |
| 5,786,727 | * | 7/1998 | Sigmon | 330/124 R |
| 6,085,074 | * | 7/1998 | Cygan | 330/295 |

OTHER PUBLICATIONS

"RF Power Amplifiers for Wireless Communications", by Steve C. Cripps, International Standard Book No: 0–89006–989–1, Library of Congress Catalog Card No: 99–17792, Chapter 8, pp. 219–242, 332, published by Artech House, Boston—London.

"High Efficiency Communications Amplifier" by P. R. Maloney, D. M. Upton, Raytheon Company, Wayland Mass., and R. J. McMorrow, Alpha Industries, published in Applied Microwave & Wireless, Summer 1994, pp. 29–39.

"A New High Efficiency Power Amplifier For Modulated Waves", W. H. Doherty, Proceedings of the IRE, Sep. 1936, vol. 24, No. 9, pp. 1163–1182.

* cited by examiner

Primary Examiner—Robert Pascal
Assistant Examiner—Patricia T. Nguyen
(74) Attorney, Agent, or Firm—David L. Smith

(57) ABSTRACT

There is disclosed a power amplifier includes an in-phase power splitter generating two split signals from an input signal, and two amplifiers capable of operating in different modes. The split signals are provided as respective inputs to the two amplifiers which are coupled through transmission lines such that as the first amplifier approaches the maximum power it can produce, the output from the second amplifier begins to contribute to the power amplifier output and supplements and modifies the power provided by the first amplifier thereby extending the range of input power over which the power amplifier delivers output power.

24 Claims, 3 Drawing Sheets

EFFICIENT POWER AMPLIFIER

FIELD OF THE INVENTION

This application relates to communications systems and particularly to communications systems including power amplifiers.

BACKGROUND OF THE INVENTION

A communications system permits at least one-way, and usually two-way, communications between a transmitter and a receiver. The transmitter may be part of a first transceiver and the receiver may be part of a second transceiver. In most communications systems, a power amplifier is used to increase the power level present in a signal to be transmitted over a channel from a lower power level to a higher power level to drive downstream components. In a system in which signals are transmitted by modulating a radio frequency, the power amplifier may drive an antenna.

The efficiency of a power amplifier determines the portion of power provided to a power amplifier that is included in the output of the power amplifier. The greater the efficiency of a power amplifier, the more effectively energy is converted into signal energy rather than being dissipated as heat. Furthermore, the greater the efficiency, the less power a device may consume to provide a desired level of output power. This is particularly important in battery operated devices where wasting power shortens the useful life of each charge on the battery.

A technique is disclosed in an article by Maloney, P. R. Upton, D. M. and McMorrow, R. J., entitled: *"High Efficiency Communications Amplifier"* published in Applied Microwave & Wireless, Summer 1994, that teaches the Doherty Amplifier Principle. The Doherty amplifier principle couples the output of two amplifiers directly into a single load impedance. The Doherty amplifier achieves high efficiency by operating one Class B amplifier into a load impedance two times larger than its optimum. This amplifier compresses and reaches peak efficiency at half of its maximum output power. A second amplifier is made active only during the peaks of the input signal and is used to modulate the effective load impedance presented to the first amplifier. Maximum efficiency is achieved when the second amplifier puts out full power. Thus, the first amplifier is kept on the verge of saturation for a 6 dB range of output power and near peak efficiency is maintained.

What is needed is an efficient power amplifier that more effectively converts energy into useful signal levels. Such an efficient power amplifier would provide a greater power output for a given input power and result in longer battery life for battery powered devices.

SUMMARY OF THE INVENTION

In accordance with the invention, a power amplifier includes an in-phase power splitter generating two split signals from an input signal, and two amplifiers capable of operating in different modes. The split signals are provided as respective inputs to the two amplifiers which operate in parallel. The amplifiers are coupled through transmission lines such that as the first amplifier approaches the maximum power it can produce, the output from the second amplifier begins to contribute to the power amplifier output and supplements and modifies the power provided by the first amplifier thereby extending the range of input over which the power amplifier delivers output power.

DETAILED DESCRIPTION

Figure 1:
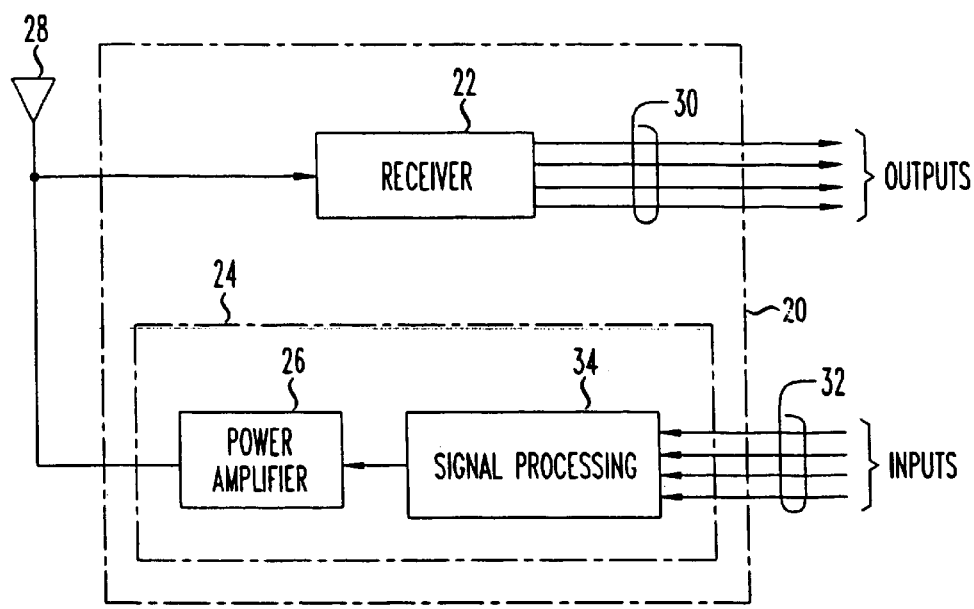
FIG. 1 is a simplified block diagram of a transceiver in accordance with the present invention.

A block diagram of a transceiver 20 in accordance with the present invention is shown in FIG. 1. Transceiver 20 is comprised of receiver 22 and transmitter 24. Transmitter 24 includes a power amplifier 26 having an in-phase power splitter which generates two split signals from an input signal and two amplifiers capable of operating in different modes. The split signals are provided as respective inputs to the two amplifiers which are coupled through transmission lines such that as the first amplifier approaches the maximum power it can produce, the output from the second amplifier begins to contribute to the power amplifier output and supplements the power provided by the first amplifier thereby extending the range of input power over which the power amplifier delivers output power. Furthermore, the second amplifier modifies the load line, as "seen" by the first amplifier, thereby improving the efficiency of the first amplifier.

Transceiver 20, shown in the simplified block diagram of FIG. 1, is illustrative of a communications system or a portion of a communications system including but not limited to a two-way radio, a cellular telephone handset, a cellular telephone base station, a local wireless network, instrument scientific measurement band equipment, direct broadcast satellite, a broadband video tuner, a television set-top box, personal communication system, or a personal computer cable modem.

In the radio frequency application illustrated in FIG. 1, a signal received by antenna 28 is processed by receiver 22 to produce output 30. Information to be transmitted by transmitter 24, such as voice, data, or multimedia information, is received among inputs 32. Signal processing block 34 processes the information and provides one or more signals to power amplifier 26. Power amplifier 26 drives antenna 28 when a signal is transmitted by transmitter 24. Power amplifier 26 may be manufactured as an integrated circuit or as a portion of an integrated circuit.

Figure 2:
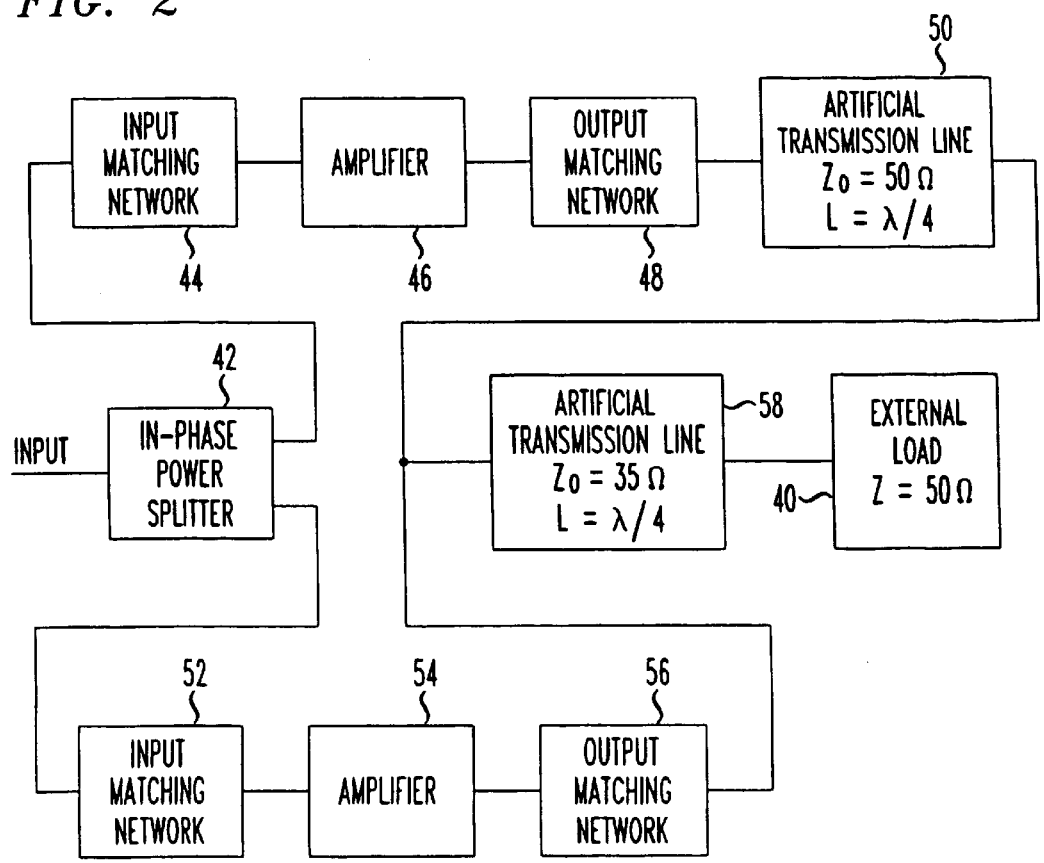
FIG. 2 is a simplified block diagram of a power amplifier in accordance with the present invention.

Coupled to an external load 40, power amplifier 26, which may be manufactured as an integrated circuit using any known processing technology, is shown in more detail in the simplified block diagram of FIG. 2. An input signal is provided as an input to in-phase power splitter 42. Power splitter 42 splits input signal into first and second split signals. Preferably the first and second split signals are of equal power and of the same phase.

The first split signal may be passed through an input matching network 44 to amplifier 46. Amplifier 46 operates in a first mode of operation, such as in class A operation. A class A amplifier is a linear amplifier in which the collector or drain current flows for one-hundred percent of the input cycle of the input signal. This corresponds to the use of bias points and input signals such that transistor operation always remains within the active operating region of the transistor voltage-current characteristics and the transistor is not driven to the cutoff point.

The output signal from amplifier 46 may be passed through an output matching network 48, then provided as an input to a transmission line 50. Transmission line 50 may be a transmission line or a lumped parameter implementation representing a transmission line. The output of transmission line 50 is coupled as an input to transmission line 58 such that the output signal from transmission line 50 provides an input signal to transmission line 58.

The second split signal may be passed through an input matching network 52 to amplifier 54. Amplifier 54 preferably operates in a second mode of operation that differs from the mode of operation of amplifier 46, such as in class C operation. A class C amplifier is an amplifier in which the collector or drain current flows for less than one-hundred percent of the input cycle of the input signal. Class C operation of an amplifier occurs when the transistor is biased in the cut-off region of the transistor voltage-current characteristics and an output signal is present only when the input signal to the amplifier causes transistor operation to be in the linear region of the transistor voltage-current characteristics. This results in a series of pulses, one per cycle of the input signal, occurring near the peak of the input signal.

The output signal from amplifier 54 may be passed through an output matching network 56, then provided as an input to transmission line 58. Transmission line 58 may be a transmission line or a lumped implementation of a transmission line. The output of transmission line 58 is coupled to an external load 40 such that the output signal from transmission line 58 provides an input signal to external load 40.

By way of example, load 40 has a 50 ohm characteristic impedance, transmission line 58 has a characteristic impedance of 35 ohms and has a length that is a quarter wave transformer. Similarly, transmission line 46 has a characteristic impedance of 50 ohms and a length that is a quarter wave transformer. Amplifier 46 operates as a class A amplifier while amplifier 54 operates as a class C amplifier. When amplifier 54 is not operating, its output impedance is very high. Thus, the 50 ohm external load of 40 is transformed by transmission line 58 from 50 ohms at the output of transmission line 58 to 25 ohms at the input to transmission line 58. Since the input to transmission line 58 is also the output of transmission line 50, the 25 ohms appear as a 25 ohm load on transmission line 50. The 25 ohm apparent load on transmission line 50 is transformed across transmission line 50 to be 100 ohms by the 50 ohm characteristic impedance of transmission line 50. The 100 ohm impedance appearing at the input of transmission line 50 provides a 100 ohm load to amplifier 46 operating as a class A amplifier.

As is known in the art, the input impedance, $Z_{in}$, of a terminated transmission line can be calculated knowing the characteristic impedance, $Z_o$, and the load impedance, $Z_L$, on the transmission line as:

$$Z_{in} = \frac{Z_o^2}{Z_L}$$

See for example Chapter 7 of Electromagnetic Waves and Radiating Systems, $2^{nd}$ ed., by E. C. Jordan and K. G. Balmain, published by Prentice Hall, Inc., the disclosure of which is incorporated by reference.

In the example, amplifier 54 is operates as a class C amplifier. The output impedance of amplifier 54 decreases as amplifier 54 is turned on. The decreased output impedance of amplifier 54 causes the impedance between transmission line 50 and transmission line 58 to decrease to approximately or below 25 ohms. This lower load impedance as seen by transmission line 50 is then transformed by transmission line 50 to a higher impedance as seen by amplifier 46, causing the load on, and thus the load line of operation of, the class A amplifier to increase, that is decrease in slope.

Figure 3:
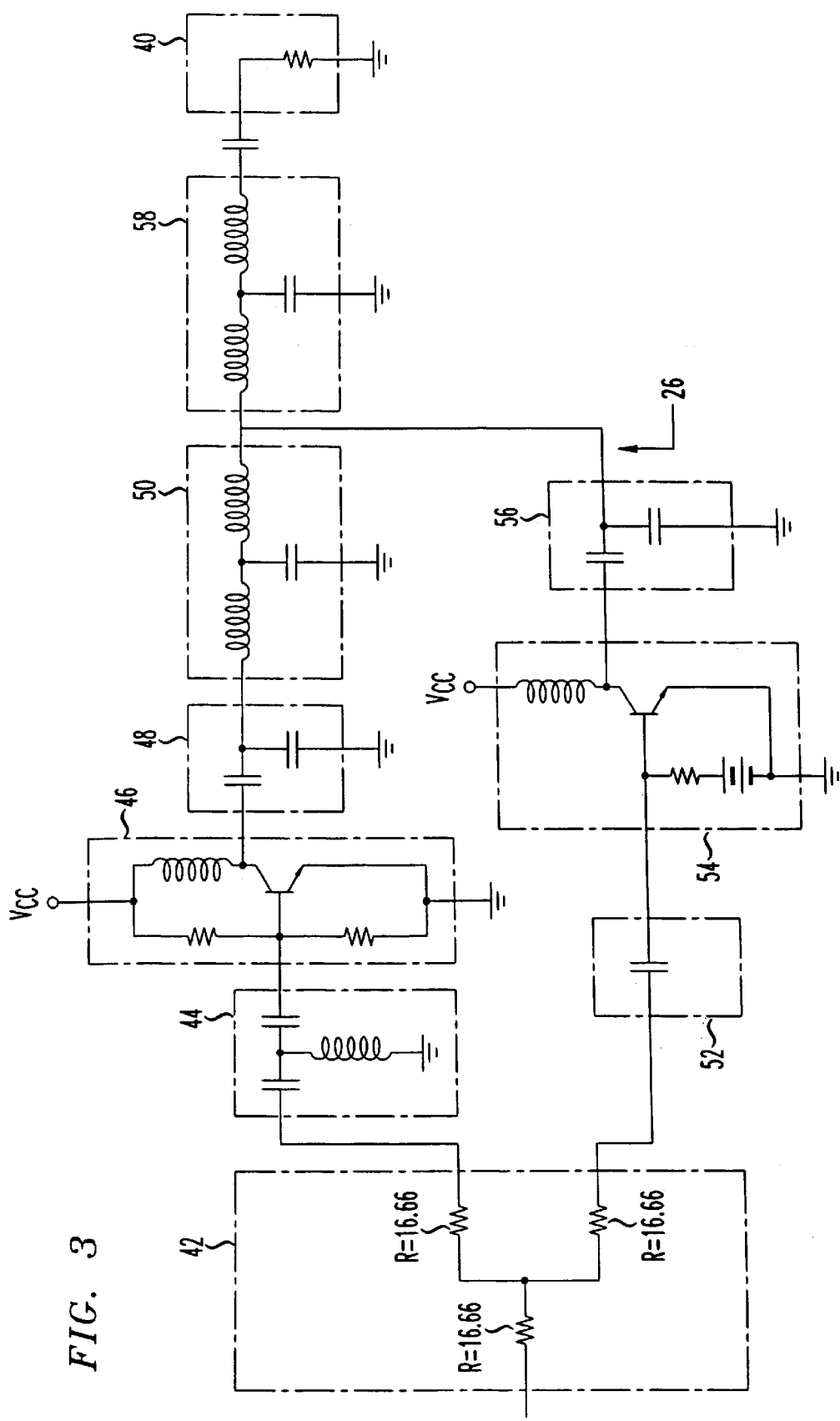
FIG. 3 is a simplified schematic diagram of a power amplifier in accordance with the present invention.

As the load line on amplifier 46 operating as a class A amplifier increases, amplifier 46 can provide the same voltage swing output with less current input and operation of amplifier 46 is maintained in a more efficient region as the input signal level increases. Simultaneously, the much higher efficiency amplifier 54 operating as a class C amplifier also provides output power. The additional power provided by amplifier 54 is combined with the power output provided by amplifier 46 as the output power from power amplifier 26 to expand and improve the range of power over which power amplifier 26 operates FIG. 3 is a simplified schematic diagram of a power amplifier 26, coupled to an external load 40. While typical component values are indicated in FIG. 3, one skilled in the art could size the components for a particular application.

In-phase signal splitter 42 is a broadband, frequency insensitive power splitter. Transmission lines 50 and 58 are shown as lumped parameter quarter wave transformers. While lumped parameter quarter wave transformers are illustrated to provide impedance transformation, any type of impedance transformation would suffice. In a lumped parameter implementation, with characteristic impedance, Z, of a transmission line is, to a first approximation, equal to the square root of the quotient of the inductance divided the capacitance. The circuit is simplified by keeping the static phase difference between a circuit comprised of input matching network 44, amplifier 46, output matching network 48 and artificial transmission line 50 and a circuit comprised of input matching network 52, amplifier 54, and output matching network 56 near zero thereby summing voltages at the junction of artificial transmission line 50, output matching network 56 and artificial transmission line 58 in phase.

Figure 4:
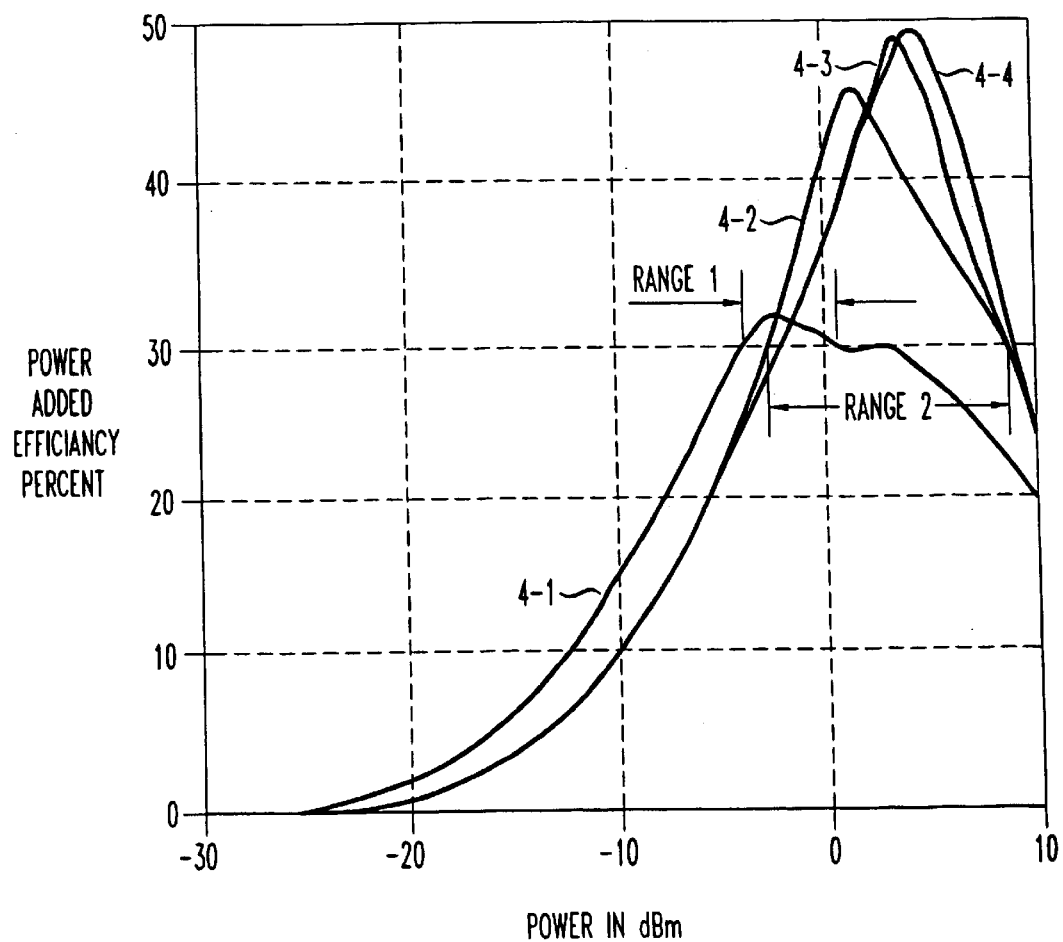
FIG. 4 is a graphical representation of the improved power output.

FIG. 4 is a graphical representation of the power added efficiency of amplifier 26 as a function of the input signal power. Power added efficiency $P_{AE}$ is defined as where:

$$P_{AE} = \frac{P_{OUT} - P_{IN}}{P_{DC}} \times 100$$

$P_{OUT}$ is the output power from the amplifier, in watts;

$P_{IN}$ is the input power to the amplifier, in watts; and $P_{DC}$ is the DC power consumption of the amplifier, in watts. Curve 4-1 illustrates, for comparison, the power added efficiency of power amplifier 26 for the above example with both amplifiers 46 and 54 operating in class A mode of operation. Curves 4-2, 4-3 and 4-4 illustrate the power added efficiency of power amplifier 26 with amplifier 46 operating in class A mode of operation and amplifier 54 operating in the class C mode of operation. Curve 4-2 illustrates amplifier 54 operating with a small magnitude conduction angle. Curve 4-3 illustrates amplifier 54 operating with an intermediate magnitude conduction angle; curve 4-4 illustrates amplifier 54 operating with a large magnitude conduction angle and illustrates the insensitivity of the static phase difference to changes in conduction angle.

In each of curves 4-2, 4-3 and 4-4, the power added efficiency of power amplifier 26 exceeds the power added efficiency of a similar, single class A power amplifier as represented by the curve 4-1. This can be seen by curves 4-2, 4-3 and 4-4 extending vertically above the curve 4-1 for a larger input power range.

For example, the power added efficiency of greater than 30% is shown in FIG. 4, curve 4-1 as range 1, of approximately 5 dB, and an input range of power for a power added efficiency of greater than 30% is shown in FIG. 4, curve 4-2 as range 2, of approximately 10 dB.

What is claimed is:

1. A power amplifier, comprising:
   a frequency insensitive in-phase power splitter for receiving an input signal and generating first and second split signals;
   a first amplifier capable of operating in a first mode of operation, the first amplifier adapted to receive the first split signal and produce a first amplifier output signal;
   a first transmission line having a first characteristic impedance and a first phase, the first transmission line adapted to receive the first amplifier output signal at a first end thereof and transmit the first amplifier output signal thereacross to a second end, the first amplifier and first transmission line collectively resulting in a first transmission line output signal having a first predetermined static phase;
   a second amplifier capable of operating in a second mode of operation, the second mode of operation differing from the first mode of operation, the second amplifier adapted to receive the second split signal as an input and produce a second amplifier output signal; and
   a second transmission line having a second characteristic impedance and a second phase, a first end of the second transmission line coupled to the second end of the first transmission line, the first end of the second transmission line also coupled to receive the second amplifier output signal, the second transmission line adapted to transmit signals provided at the first end to a second end thereof, the second amplifier and second transmission line collectively resulting in a second transmission line output signal having a second predetermined static phase in-phase with the first transmission line output signal.

2. A power amplifier as recited in claim 1, wherein the in-phase power splitter splits the input signal into first and second split signals of equal power.

3. A power amplifier as recited in claim 1, wherein the in-phase power splitter splits the input signal into first and second split signals of equal phase.

4. A power amplifier as recited in claim 1, wherein the first mode of operation is class A mode of operation.

5. A power amplifier as recited in claim 1, wherein at least one of the first and second transmission lines is a lumped implementation of a transmission line.

6. A power amplifier as recited in claim 1, wherein both the first and second transmission lines are lumped implementations of a transmission line.

7. A power amplifier as recited in claim 1, wherein the first characteristic impedance is 50 ohms.

8. A power amplifier as recited in claim 1, wherein the first length is a one-fourth wavelength transformer.

9. A power amplifier as recited in claim 1, wherein the second characteristic impedance is 35 ohms.

10. A power amplifier as recited in claim 1, wherein the second length is a one-fourth wavelength transformer.

11. A power amplifier as recited in claim 1, wherein the second mode of operation is class C mode of operation.

12. A power amplifier as recited in claim 1, further comprising an input matching network interposed between the in-phase power splitter and at least one of the first and second amplifier.

13. A power amplifier as recited in claim 1, further comprising an output matching network interposed between at least one of the first and second amplifiers and one of said first and second transmission lines.

14. An integrated circuit including a power amplifier, comprising:
    a frequency insensitive in-phase power splitter for receiving an input signal and generating first and second split signals;
    a first amplifier capable of operating in a first mode of operation, the first amplifier adapted to receive the first split signal and produce a first amplifier output signal;
    a first transmission line having a first characteristic impedance and a first phase, the first transmission line adapted to receive the first amplifier output signal at a first end thereof and transmit the first amplifier output signal thereacross to a second end, the first amplifier and first transmission line collectively resulting in a first transmission line output signal having a first predetermined static phase;
    a second amplifier capable of operating in a second mode of operation, the second mode of operation differing from the first mode of operation, the second amplifier adapted to receive the second split signal as an input and produce a second amplifier output signal; and
    a second transmission line having a second characteristic impedance and a second phase, a first end of the second transmission line coupled to the second end of the first transmission line, the first end of the second transmission line also coupled to receive the second amplifier output signal, the second transmission line adapted to transmit signals provided at the first end to a second end thereof, the second amplifier and second transmission line collectively resulting in a second transmission line output signal having a second predetermined static phase in-phase with the first transmission line output signal.

15. An integrated circuit as recited in claim 14, wherein at least one of the first and second transmission lines is a lumped implementation of a transmission line.

16. An integrated circuit as recited in claim 14, wherein the first characteristic impedance is 50 ohms.

17. An integrated circuit as recited in claim 14, wherein at least one of the first and second lengths is a one-fourth wavelength transformer.

18. An integrated circuit as recited as recited in claim 14, further comprising an input matching network interposed between the in-phase power splitter and at least one of the first and second amplifier.

19. A transmitter including a power amplifier, comprising
    an in-phase power splitter for receiving an input signal and generating first and second split signals;
    a first amplifier capable of operating in a first mode of operation, the first amplifier adapted to receive the first split signal and produce a first amplifier output signal;
    a first transmission line having a first characteristic impedance and a first phase, the first transmission line adapted to receive the first amplifier output signal at a first end thereof and transmit the first amplifier output signal thereacross to a second end;
    a second amplifier capable of operating in a second mode of operation, the second mode of operation differing from the first mode of operation, the second amplifier adapted to receive the second split signal as an input and produce a second amplifier output signal; and
    a second transmission line having a second characteristic impedance and a second phase, a first end of the second transmission line coupled to the second end of the first transmission line, the first end of the second transmission line also coupled to receive the second amplifier output signal, the second transmission line adapted to transmit signals provided at the first end to a second end thereof, the second amplifier and second transmission line collectively resulting in a second transmission line output signal having a second predetermined static phase in-phase with the first transmission line output signal.

20. A transmitter as recited in claim 19, wherein at least one of the first and second transmission lines is a lumped implementation of a transmission line.

21. A transmitter as recited in claim 19, wherein the first characteristic impedance is 50 ohms.

22. A transmitter as recited in claim 19, wherein at least one of the first and second lengths is a one-fourth wavelength transformer.

23. A transmitter as recited in claim 19, further comprising an input matching network interposed between the in-phase power splitter and at least one of the first and second amplifier.

24. A transmitter as recited in claim 19, further comprising a receiver.

* * * * *